US008425715B2

(12) United States Patent
George (10) Patent No.: US 8,425,715 B2
(45) Date of Patent: Apr. 23, 2013

(54) APPARATUS FOR HIGH THROUGHPUT WAFER BONDING

(75) Inventor: Gregory George, Colchester, VT (US)

(73) Assignee: Suss Microtec Lithography, GmbH, Garching (DE)

( * ) Notice: Subject to any disclaimer, the term of this patent is extended or adjusted under 35 U.S.C. 154(b) by 53 days.

(21) Appl. No.: 13/079,446

(22) Filed: Apr. 4, 2011

(65) Prior Publication Data

US 2012/0080146 A1 Apr. 5, 2012

Related U.S. Application Data

(60) Provisional application No. 61/322,980, filed on Apr. 12, 2010.

(51) Int. Cl.
| | |
|---|---|
| B29C 65/00 | (2006.01) |
| B29C 65/08 | (2006.01) |
| B29C 45/00 | (2006.01) |
| B29C 47/00 | (2006.01) |
| B29C 43/02 | (2006.01) |
| B29C 49/00 | (2006.01) |
| B29C 51/00 | (2006.01) |
| B29C 43/10 | (2006.01) |
| B32B 37/00 | (2006.01) |
| B30B 5/02 | (2006.01) |
| B30B 5/04 | (2006.01) |
| B30B 15/34 | (2006.01) |
| H01L 21/30 | (2006.01) |
| H01L 21/46 | (2006.01) |
| H01L 21/76 | (2006.01) |
| B29D 24/00 | (2006.01) |
| B29D 29/00 | (2006.01) |
| B28B 21/36 | (2006.01) |
| A01J 21/00 | (2006.01) |
| A01J 25/12 | (2006.01) |
| A21C 3/00 | (2006.01) |
| A21C 11/00 | (2006.01) |
| A23G 1/20 | (2006.01) |
| A23G 3/02 | (2006.01) |
| A23P 1/00 | (2006.01) |
| B28B 11/08 | (2006.01) |
| B29C 55/28 | (2006.01) |

(52) U.S. Cl.
USPC ........ 156/286; 156/285; 156/382; 156/583.1; 156/582; 438/455; 438/456; 438/404; 438/406; 264/511; 264/553; 264/571; 425/504; 425/388; 425/405.1; 425/405.2

(58) Field of Classification Search .................. 156/285, 156/286, 382, 582, 583.1; 438/455, 456, 438/404, 406; 264/511, 553, 571; 425/504, 425/388, 405.1, 405.2
See application file for complete search history.

(56) References Cited

U.S. PATENT DOCUMENTS 5,314,107 A * 5/1994 d'Aragona et al. ........... 228/116
(Continued)

FOREIGN PATENT DOCUMENTS

| JP | 2005109216 A | 4/2005 |
| JP | 2010010628 A | 1/2010 |

Primary Examiner — Christopher Schatz
Assistant Examiner — Matthew Hoover
(74) Attorney, Agent, or Firm — AKC Patents LLC; Aliki K. Collins (57) ABSTRACT

An industrial-scale high throughput wafer bonding apparatus includes a wafer bonder chamber extending along a main axis and comprising a plurality of chamber zones, a plurality of heater/isolator plates, a guide rod system extending along the main axis, a pair of parallel track rods extending along the main axis, and first pressure means. The chamber zones are separated from each other and thermally isolated from each other by the heater/isolator plates. The heater/isolator plates are oriented perpendicular to the main axis, are movably supported and guided by the guide rod system and are configured to move along the direction of the main axis. Each of the chamber zones is dimensioned to accommodate an aligned wafer pair and the wafer pairs are configured to be supported by the parallel track rods. The first pressure means is configured to apply a first force perpendicular to a first end heater/isolator plate. The applied first force causes the heater/isolator plates to move toward each other along the main axis and thereby causes the collapse of each chamber zone volume and the application of bonding pressure onto the wafer pairs.

17 Claims, 9 Drawing Sheets

U.S. PATENT DOCUMENTS

| | | |
|---|---|---|
| 5,502,316 A | 3/1996 | Kish et al. |
| 6,844,242 B2 * | 1/2005 | Naruoka et al. ............. 438/455 |
| 2008/0153258 A1 | 6/2008 | Thallner |
| 2009/0317960 A1 * | 12/2009 | Izumi ........................... 438/455 |

* cited by examiner

FIG. 6

APPARATUS FOR HIGH THROUGHPUT WAFER BONDING

CROSS REFERENCE TO RELATED CO-PENDING APPLICATIONS

This application claims the benefit of U.S. provisional application Ser. No. 61/322,980 filed Apr. 12, 2010 and entitled "APPARATUS FOR HIGH THROUGHPUT WAFER BONDING", the contents of which are expressly incorporated herein by reference.

FIELD OF THE INVENTION

The present invention relates to an apparatus for wafer bonding, and more particularly to an industrial-scale high throughput wafer bonding apparatus used to bond multiple wafer pairs.

BACKGROUND OF THE INVENTION

Figure 1:
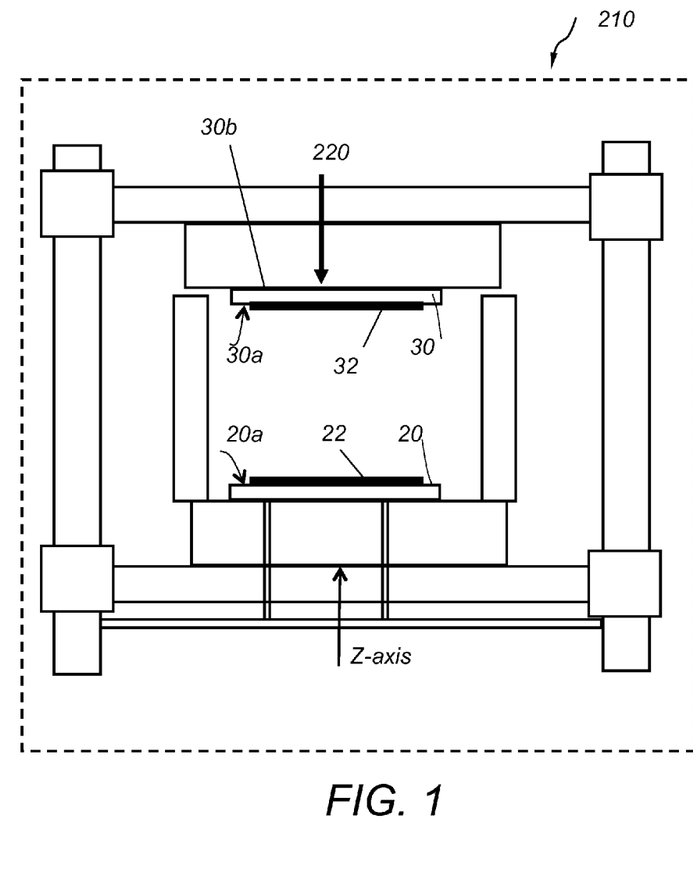
FIG. 1 is a schematic diagram of a prior art single wafer pair bonder apparatus.

Wafer bonding involves aligning two wafers parallel to each other, bringing them in contact with each other and then applying heat and force to the aligned stack of the two wafers. Referring to FIG. 1, in a wafer bonder apparatus 210, a first wafer 30 having a bond layer 32 on a first surface 30a is brought into contact with a second wafer 20 having a bond layer 22 on a first surface 20a, so that the two bond layers 31 and 22 are opposite to each other. The wafer bonding process involves orienting the two wafers parallel to each other and compressing the two wafers together by applying a force 220 on a second surface 30b of the first wafer 30. Force 220 is usually applied to the center of the wafer stack 30 with a piston-type mechanism. This bonder apparatus provides precise wafer bonding and is suitable for bonding one wafer pair at a time. In some applications, however, it is desirable to bond several wafer pairs at once in order to increase bonder throughput and to reduce device cost. Accordingly, there is a need for a high throughput industrial scale wafer bonder apparatus for bonding several wafer pairs at once.

SUMMARY OF THE INVENTION

The present invention relates to an industrial-scale high throughput wafer bonding apparatus used to bond multiple wafer pairs.

In general, in one aspect, the invention features a multi-pair wafer bonder apparatus including a wafer bonder chamber extending along a main axis and comprising a plurality of chamber zones, a plurality of heater/isolator plates, a guide rod system extending along the main axis, a pair of parallel track rods extending along the main axis, and first pressure means. The chamber zones are separated from each other and thermally isolated from each other by the heater/isolator plates. The heater/isolator plates are oriented perpendicular to the main axis, are movably supported and guided by the guide rod system and are configured to move along the direction of the main axis. Each of the chamber zones is dimensioned to accommodate an aligned wafer pair and the wafer pairs are configured to be supported by the parallel track rods. The first pressure means is configured to apply a first force perpendicular to a first end heater/isolator plate. The applied first force causes the heater/isolator plates to move toward each other along the main axis and thereby causes the collapse of each chamber zone volume and the application of bonding pressure onto the wafer pairs.

Implementations of this aspect of the invention may include one or more of the following features. The apparatus further includes second pressure means configured to apply a second force perpendicular to a second end heater/isolator plate. The second end heater/isolator plate is opposite to the first end heater/isolator plate and the applied second force causes the heater/isolator plates to move toward each other along the main axis and thereby causes the collapse of each chamber zone volume and the application of bonding pressure onto the wafer pairs. The first and second pressure means comprise a piston or a pressurized gas. The wafer bonder chamber main axis is horizontal, or vertical. The wafer bonder chamber main axis is oriented at an angle relative to a horizontal plane. The wafer bonder chamber is configured to be evacuated and comprises vacuum means and gas pressurizing means. The apparatus further includes means for applying a first force column perpendicular to the first end heater/isolator plate. The first force column comprises a plurality of uniformly distributed forces arranged in a column having a base dimensioned to match the entire bond interface area between each of the wafer pairs. The apparatus further includes means for applying a second force column to a second end heater/isolator plate. The second end heater/isolator plate is opposite to the first end heater/isolator plate, and the applied second force column causes the heater/isolator plates to move toward each other along the main axis of the wafer bonder chamber and thereby causes the collapse of each chamber zone volume, and the application of bonding pressure onto the wafer pairs. The second force column comprises a plurality of uniformly distributed forces arranged in a column having a base dimensioned to match the entire bond interface area between each of the wafer pairs. The wafer bond chamber comprises a cylindrical body and first and second circular ends. The heater/isolator plate comprises heating elements embedded in a plate and the plate comprises one of ceramic, metal, steel, tungsten, titanium, and alloys or composites thereof. The heating elements comprise resistive or mica heaters. The heater/isolator plate further comprises air or water cooling elements. The heating elements are arranged in two separate heating zones and the separate heating zones are controlled independently. The apparatus further includes an automatic wafer loader and unloader. The automatic wafer loader comprises a column and a plurality of fingers extending from the column configured to carry and insert the wafer pairs into the chamber zones, respectively. The guide rod system includes three rods parallel to each other and parallel to the main axis. The chamber zones and the heater/isolator plates are thermally isolated form the wafer bonder chamber via the three rods.

In general, in another aspect, the invention features a multi-pair wafer bonding method including the following steps: First, providing a wafer bonder chamber extending along a main axis and comprising a plurality of chamber zones, a plurality of heater/isolator plates, a guide rod system extending along the main axis, a pair of parallel track rods extending along the main axis, and first pressure means. Next, applying a first force perpendicular to a first end heater/isolator plate with the first pressure means and thereby causing the heater/isolator plates to move toward each other along the main axis and the collapse of each chamber zone volume and the application of bonding pressure onto the wafer pairs. The chamber zones are separated from each other and thermally isolated from each other by the heater/isolator plates. The heater/isolator plates are oriented perpendicular to the main axis, are movably supported and guided by the guide rod system and are configured to move along the direction of the main axis. Each of the chamber zones is dimensioned to accommodate an aligned wafer pair and the wafer pairs are configured to be supported by the parallel track rods.

Among the advantages of the invention are the following. A large number of wafer pairs can be simultaneously bonded under the same pressure, atmosphere and temperature conditions. The high throughput bonder can be used to bond wafers used in LED applications where a reflective wafer or a transparent wafer and/or an absorptive wafer are bonded onto LED wafers.

BRIEF DESCRIPTION OF THE DRAWINGS

Referring to the figures, wherein like numerals represent like parts throughout the several views.

DETAILED DESCRIPTION OF THE INVENTION

Figure 2A:
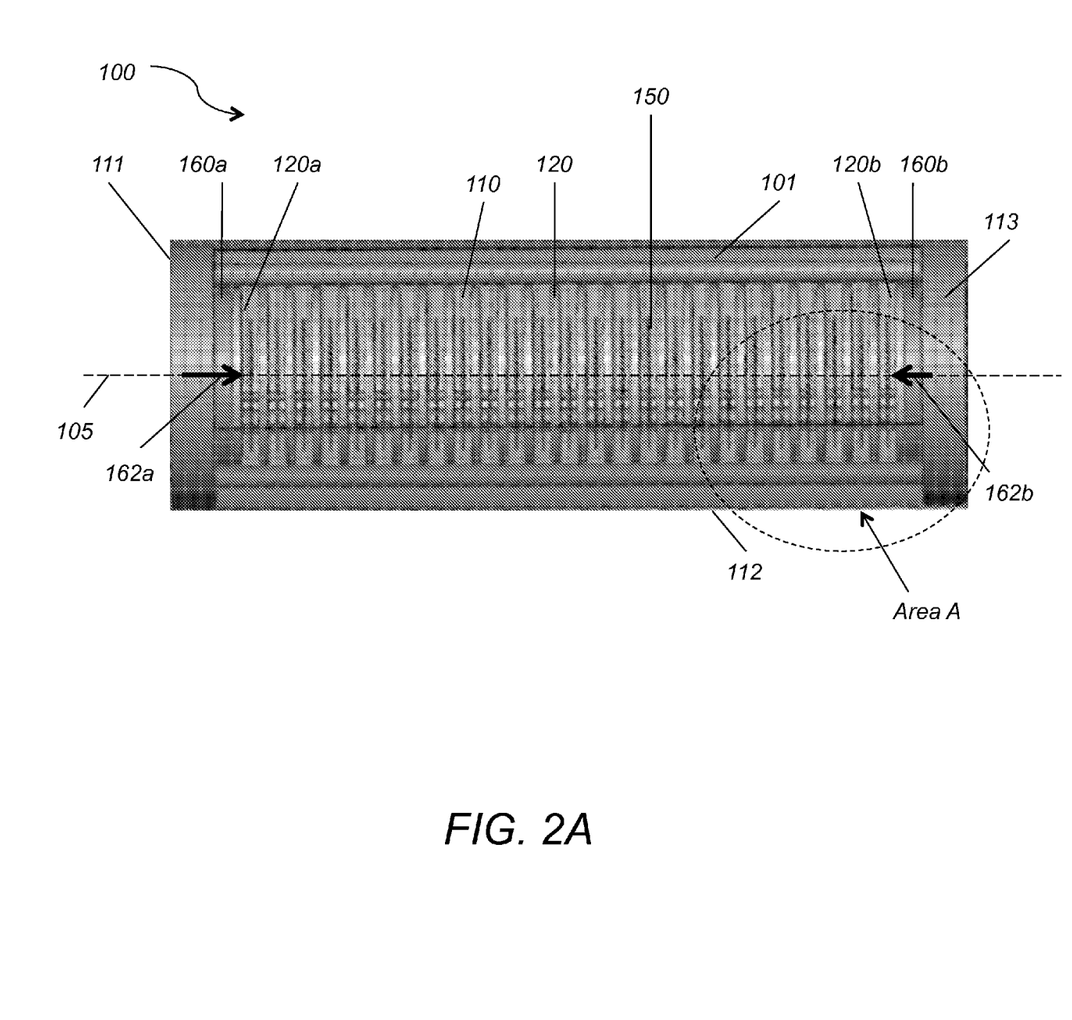
FIG. 2A is a schematic diagram of a horizontal high throughput multi wafer pair bonder apparatus according to this invention.
Figure 2B:
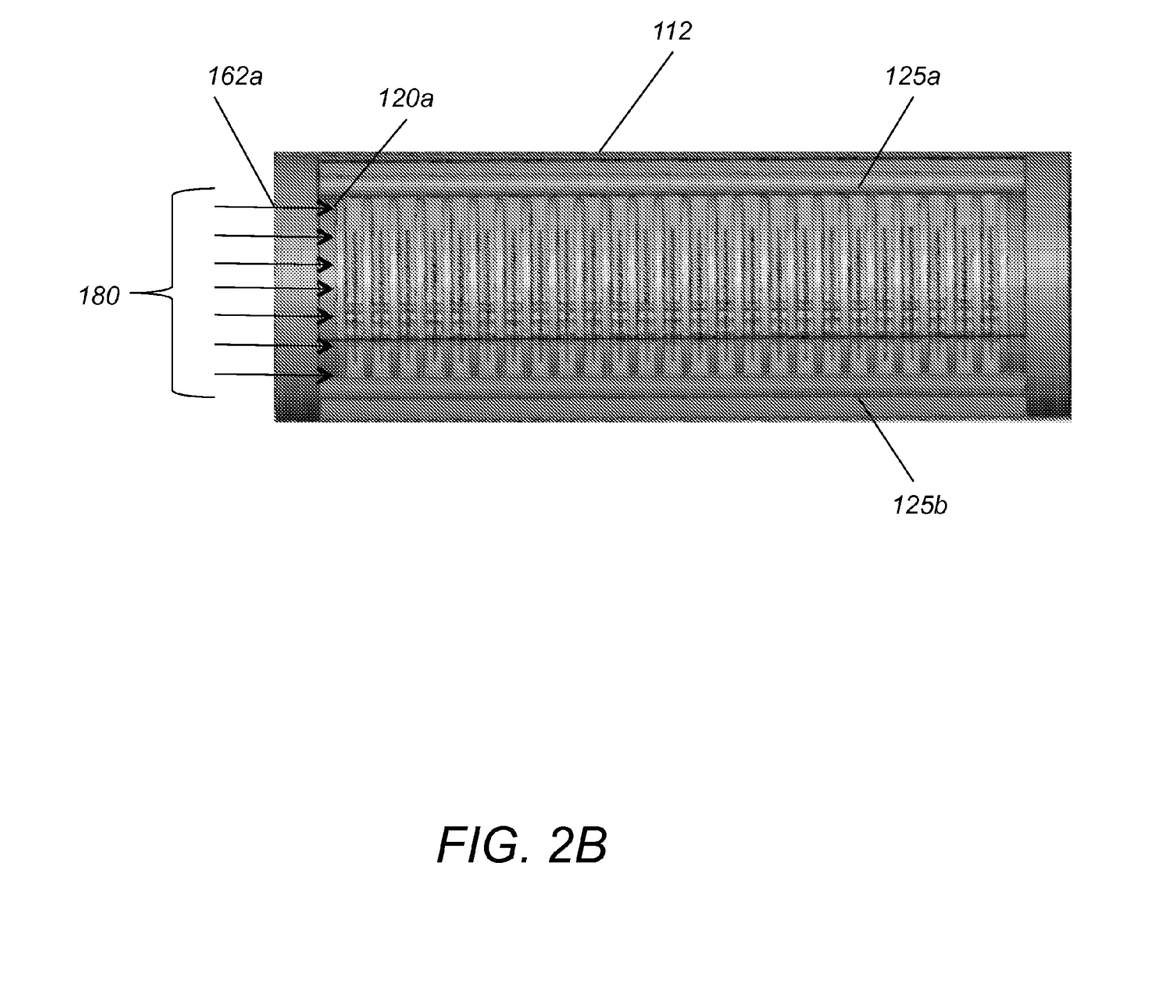
FIG. 2B is another embodiment of a high throughput multi wafer pair bonder apparatus according to this invention.
Figure 3:
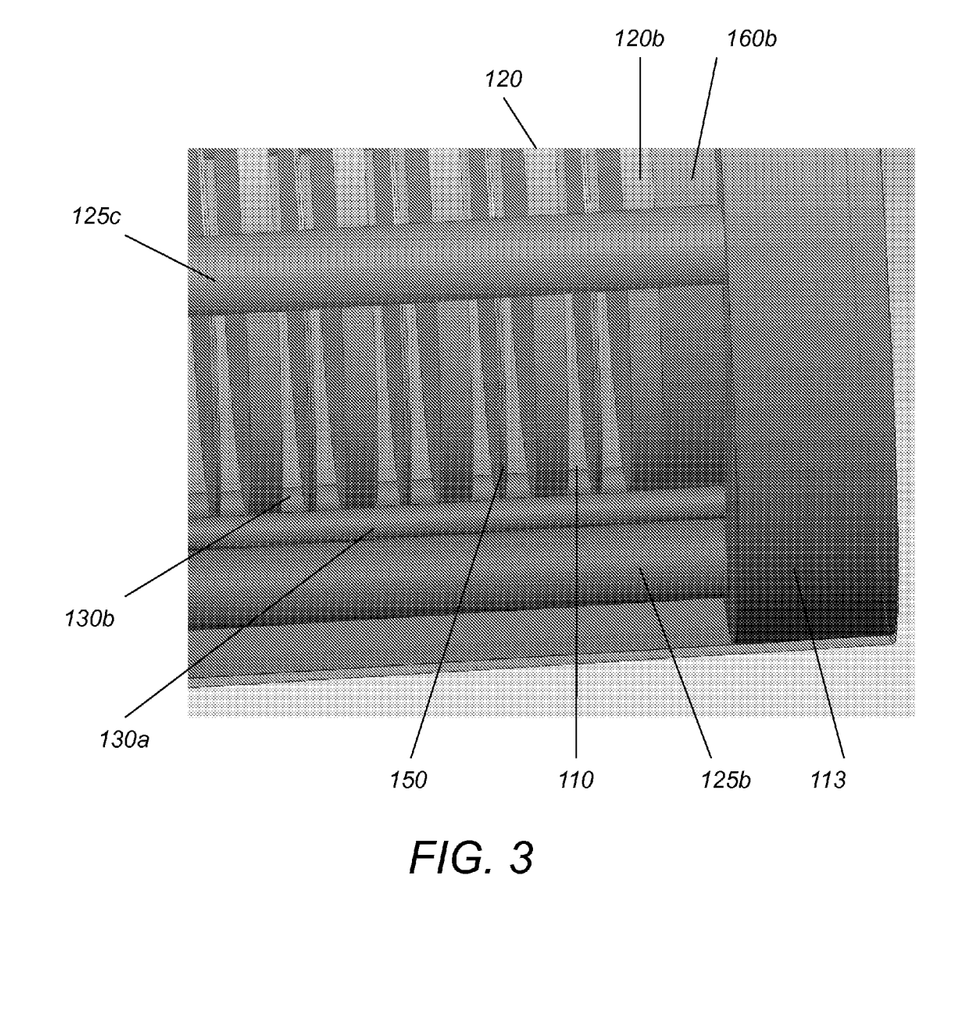
FIG. 3 is a detailed view of area A in FIG. 2A.

Referring to FIG. 2A, a high throughput wafer bonder 100 capable of bonding several wafer pairs 150 includes a horizontally oriented chamber 101 having twenty five separated chamber zones 110. Chamber 101 has a cylindrical body 112 and circular left and right side walls 111, 113, respectively. Chamber zones 110 are separated from each other by heater/isolator plates 120. Heater/isolator plates 120 are supported on a heater constraint/guide rod system that includes three parallel rods 125a, 125b, 125c, shown in FIG. 2B and FIG. 3. The heater constraint/guide rod system allows the heater/isolator plates 120 to move along the horizontal direction 105. In each chamber zone 110 a wafer pair 150 is placed and is arranged vertically to the chamber axis 105. Wafer pairs 150 rest on parallel track rods 130a, 130b that support the wafer pairs and function as alignment tracks for the wafers 120. Chamber 101 also includes left and right pistons 160a, 160b applying opposite forces 162a, 162b on the furthest left and furthest right heater/isolator end plates 120a, 120b, respectively. The applied opposite forces 162a, 162b cause the heater/isolator plates 120 to move horizontally toward each other and toward the center of the chamber 101. As the heater/isolator plates 120 move toward each other the volume of the chamber zones 110 collapses and bonding pressure is applied on the wafer pairs 150 contained in each chamber zone 110. In other embodiments, there is one only one piston 160a, or 160b applying a force 162a or 162b onto heater/isolator end plates 120a or 120b, respectively. In this case, the opposite end plate is kept stationary and the applied force collapses the chamber zones against it, as shown in FIG. 2B. In yet another embodiment, one side 160a moves to close the wafer/heater stack and then pressure is applied from both sides 160a, 160b.

In one example, the applied forces 162a, 162b are pneumatic forces in the range of 20-150 kN, and chamber 101 is 3 feet long and has a diameter of 1 foot. Chamber 101 is evacuated at the beginning of the bonding process and then filled with a pressurized gas. Inert gases or other process specific gases are supplied to chamber 101 during the bonding process.

In another embodiment, the wafer bonding process involves compressing the two end plates together by applying a "force column" 180 onto end plate 120a. Force column 180 includes a plurality of forces 162a arranged in a column having a base dimensioned to cover the entire end surface of end plate 120a and is configured to apply a uniform pressure to the entire end surface of end plate 120a and to transfer a uniform pressure to the bond interface of each wafer pair 150. In other embodiments a second force column may be applied simultaneously with force column 180 on the opposite end plate 120a. In one example, force column 180 is a pressurized gas column and applies forces of the order of 90 KN on 200 mm wafers.

Figure 6:
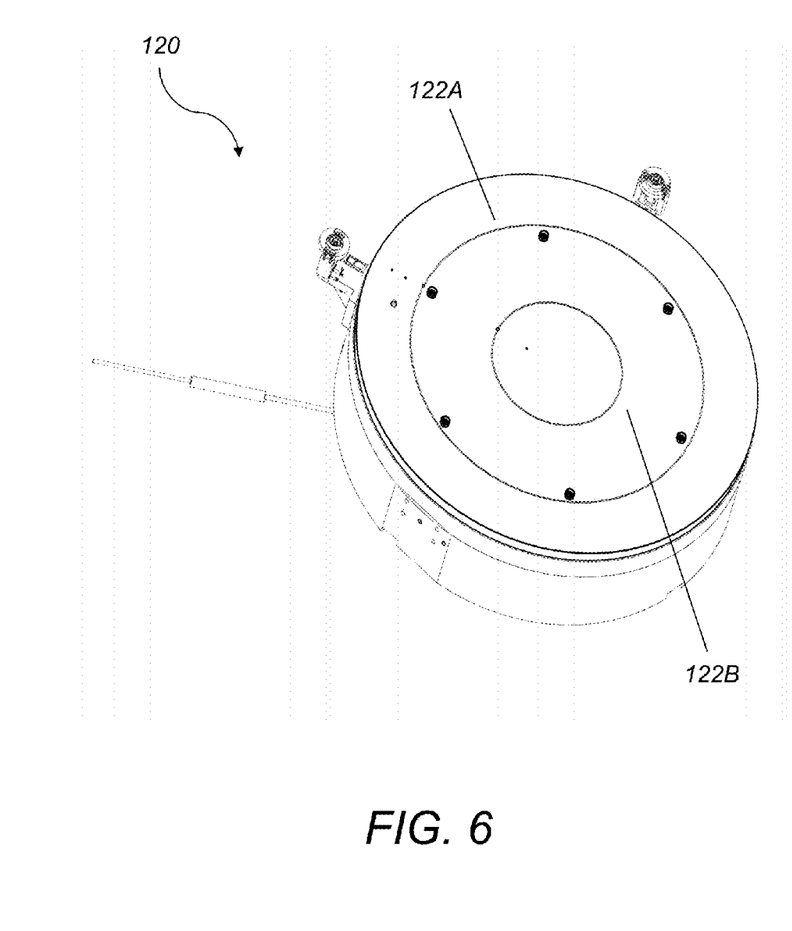
FIG. 6 is a schematic diagram of a heater plate.

Heater/isolator plates 120 are thermally isolated from the chamber wall 112 and are designed to be supported and move on the above mentioned constraint/guide rod system that includes rods 125a, 125b, and 125c. Rods 125a, 125b 125c are parallel to each other and parallel to the chamber axis. Heater/isolator plates 120 have embedded heating elements and are made of ceramic, metals, stainless steel, tungsten, titanium, alloys or composites. The heating elements may be resistive heaters or mica heaters. Heater/isolator plates 120 may also include air or water cooling elements. Typical wafer bonding temperatures are in the range between 200-400° C. In some embodiments, heaters 120 have more than one heating zones. Referring to FIG. 6, heater plate 120 includes a first heating zone 122B configured to heat the center region of the wafer and a second heating zone 122A configured to heat the periphery of the wafer. In one example, heating zone 122B is dimensioned to heat 200 millimeters wafer pairs and heating zone 122A is dimensioned to heat 300 millimeter wafer pairs in cooperation with heating zone 122B. Heating zone 122A is controlled independently from heating zone 122B in order to achieve thermal uniformity throughout the entire bond interface and to mitigate thermal losses at the edges of the wafer stack.

Figure 4:
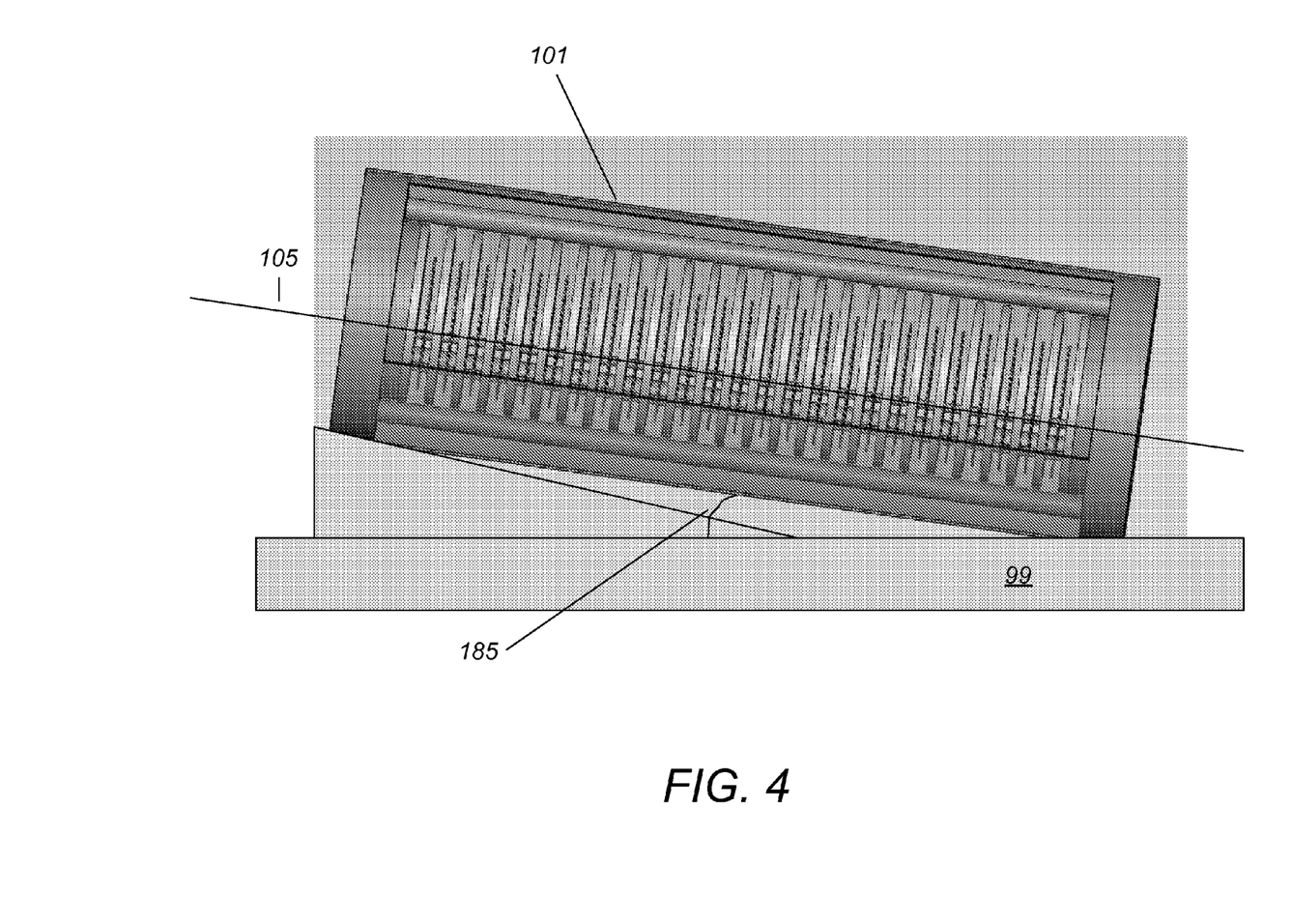
FIG. 4 is a schematic diagram of another embodiment of a high throughput multi wafer pair bonder apparatus according to this invention.
Figure 5:
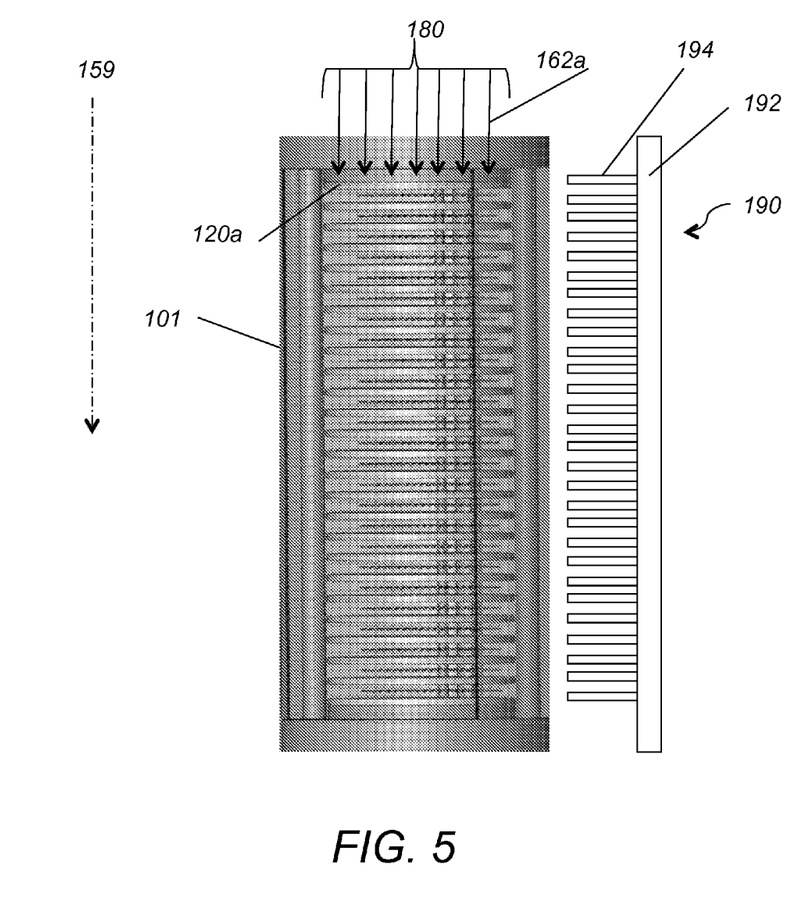
FIG. 5 is a schematic diagram of another embodiment of a high throughput multi wafer pair bonder apparatus according to this invention.

In the embodiment of FIG. 2A, chamber 101 is arranged horizontally and is suitable for tabletop operation. In other embodiments chamber 101 is oriented vertically or at an angle. Referring to FIG. 5, chamber 101 is orientated vertically and force 162a or force column 180 is applied along direction 159 from top to bottom. The wafer bonder of FIG. 5 also includes an automatic loader and unloader unit 190. In the embodiment of FIG. 4, chamber 101 is oriented at an angle 185 relative to the horizontal plane 99.

Figure 5A:
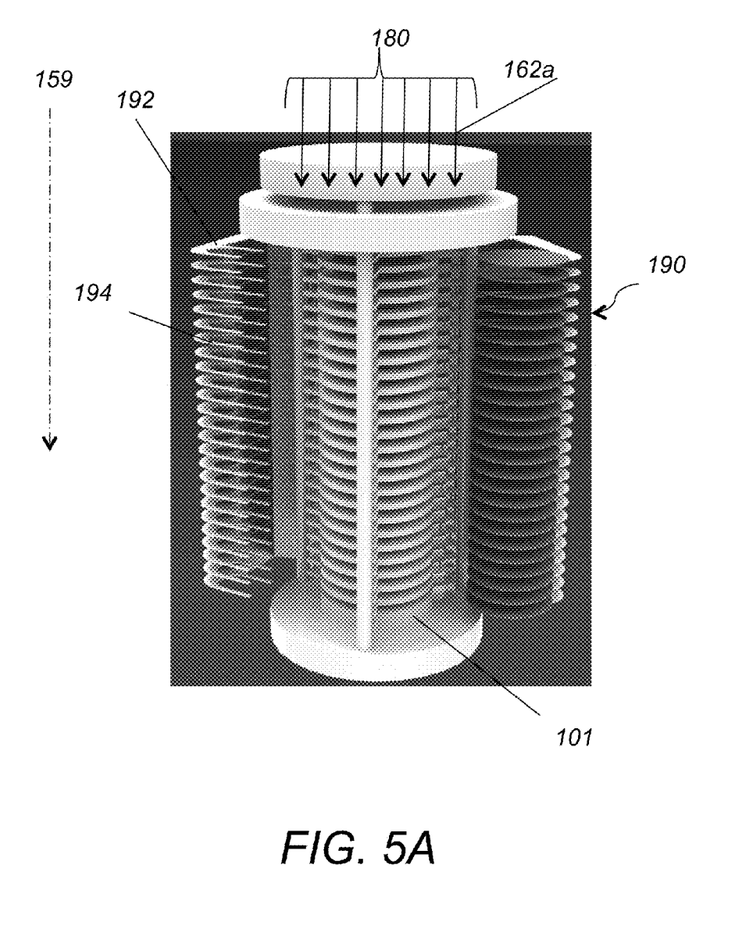
FIG. 5A and FIG. 5B are schematic diagrams of another embodiment of a high throughput multi wafer pair bonder apparatus with an automated wafer loading and unloading unit.
Figure 5B:
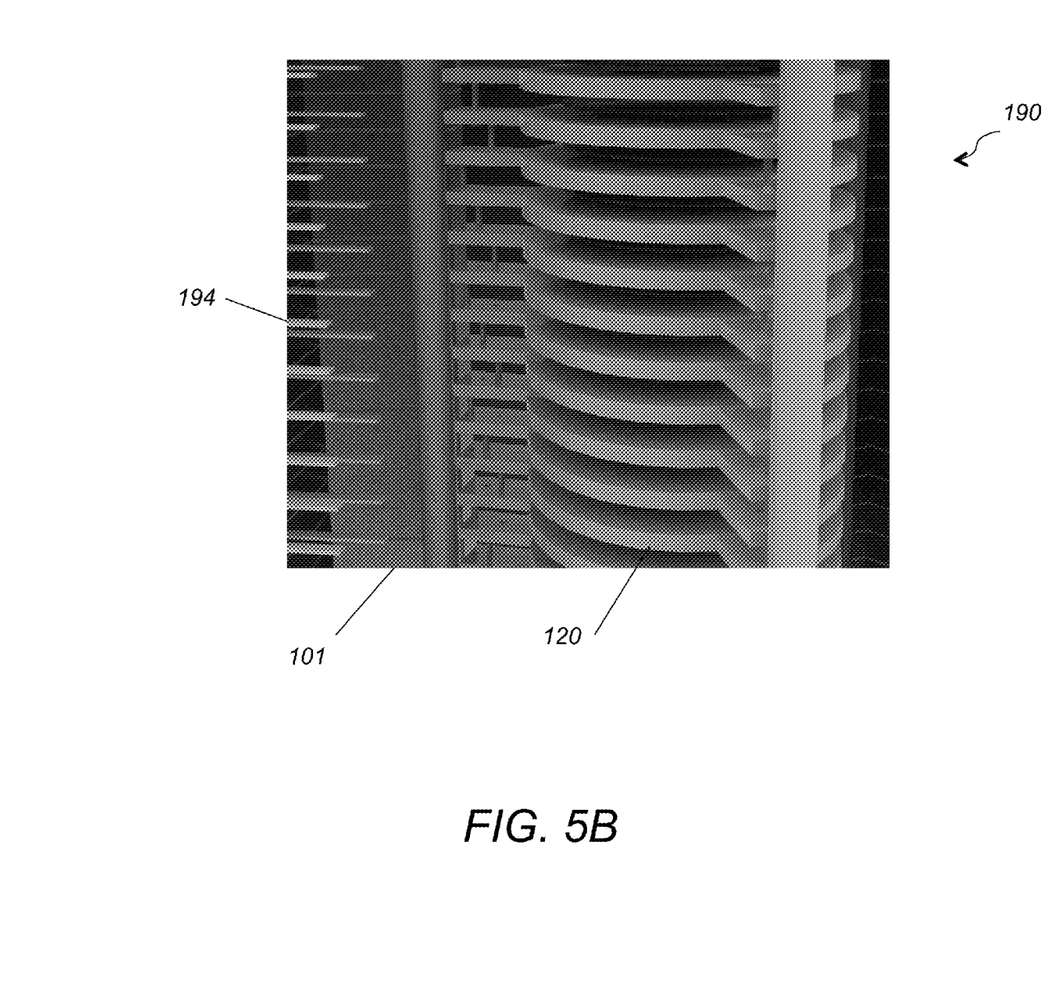

Referring back to FIG. 5, FIG. 5A and FIG. 5B, the vertically arranged automatic wafer loader and unloader unit 190 includes a vertical column 192 and fingers 194 extending horizontally from the vertical column 192. Fingers 194 carry and insert the wafer pair 150 in the separate chamber zones 110. In FIG. 5A and FIG. 5B, two automatic wafer loader and unloader units 190 are arranged left and right to the chamber 101.

Other embodiments include one or more of the following. Bonding chamber 101 may include more or less than 25 chamber zones and accordingly may bond more or less than 25 wafer pairs at a time. Bonding chamber 101 may have rectangular trigonal or polygonal cross-sections. Bonder 100 may be used to bond wafers made of GaAs, InP, GaP, GaN, SiC, other III-V, II-VI, IV-IV or ternary compounds. Bonder 100 can bond LED substrates to many different materials using Au—Au thermo-compression or AuSn eutectic bonding.

Several embodiments of the present invention have been described. Nevertheless, it will be understood that various modifications may be made without departing from the spirit and scope of the invention. Accordingly, other embodiments are within the scope of the following claims.

What is claimed is:

1. A multi-pair wafer bonder apparatus comprising:
a wafer bonder chamber extending along a main axis and comprising a plurality of chamber zones, a plurality of heater/isolator plates, a guide rod system extending along said main axis, a pair of parallel track rods extending along said main axis, and first pressure means;
wherein said plurality of chamber zones are separated from each other and thermally isolated from each other by said plurality of heater/isolator plates;
wherein said plurality of heater/isolator plates are oriented perpendicular to said main axis, are movably supported and guided by said guide rod system and are configured to move along the direction of said main axis;
wherein each of said plurality of chamber zones is dimensioned to accommodate an aligned wafer pair and wherein said wafer pairs are configured to be supported by said parallel track rods; and
wherein said first pressure means is configured to apply a first force perpendicular to a first end heater/isolator plate and wherein said applied first force causes the plurality of heater/isolator plates to move toward each other along said main axis and thereby causes the collapse of each chamber zone volume and the application of bonding pressure onto said wafer pairs.

2. The apparatus of claim 1 further comprising second pressure means configured to apply a second force perpendicular to a second end heater/isolator plate, wherein said second end heater/isolator plate is opposite to said first end heater/isolator plate and wherein said applied second force causes the plurality of heater/isolator plates to move toward each other along said main axis and thereby causes the collapse of each chamber zone volume and the application of bonding pressure onto said wafer pairs.

3. The apparatus of claim 2 wherein said first and second pressure means comprise a piston or a pressurized gas.

4. The apparatus of claim 1 wherein said wafer bonder chamber main axis is horizontal.

5. The apparatus of claim 1 wherein said wafer bonder chamber main axis is vertical.

6. The apparatus of claim 1 wherein said wafer bonder chamber main axis is oriented at an angle relative to a horizontal plane.

7. The apparatus of claim 1 wherein said wafer bonder chamber is configured to be evacuated and comprises vacuum means and gas pressurizing means.

8. The apparatus of claim 1 further comprising means for applying a first force column perpendicular to said first end heater/isolator plate and wherein said first force column comprises a plurality of uniformly distributed forces arranged in a column having a base dimensioned to match the entire bond interface area between each of said wafer pairs.

9. The apparatus of claim 8 further comprising means for applying a second force column to a second end heater/isolator plate, wherein said second end heater/isolator plate is opposite to said first end heater/isolator plate, and wherein said applied second force column causes the plurality of heater/isolator plates to move toward each other along said main axis of said wafer bonder chamber and thereby causes the collapse of each chamber zone volume, and the application of bonding pressure onto said wafer pairs, and wherein said second force column comprises a plurality of uniformly distributed forces arranged in a column having a base dimensioned to match the entire bond interface area between each of said wafer pairs.

10. The apparatus of claim 1 wherein said wafer bond chamber comprises a cylindrical body and first and second circular ends.

11. The apparatus of claim 1 wherein each of said plurality of heater/isolator plates comprises heating elements embedded in a plate and wherein said plate comprises one of ceramic, metal, steel, tungsten, titanium, and alloys or composites thereof.

12. The apparatus of claim 11 wherein said heating elements comprise resistive or mica heaters.

13. The apparatus of claim 11 wherein each of said plurality of heater/isolator plates further comprises air or water cooling elements.

14. The apparatus of claim 11 wherein said heating elements are arranged in two separate heating zones and wherein said two separate heating zones are controlled independently.

15. The apparatus of claim 1 further comprising an automatic wafer loader and unloader.

16. The apparatus of claim 15 wherein said automatic wafer loader comprises a column and a plurality of fingers extending from said column configured to carry and insert said wafer pairs into said plurality of chamber zones, respectively.

17. The apparatus of claim 1 wherein said guide rod system comprises three rods parallel to each other and parallel to the main axis and wherein said plurality of chamber zones and said plurality of heater/isolator plates are thermally isolated form the wafer bonder chamber via said three rods.

* * * * *